(12) United States Patent
Kim et al.

(10) Patent No.: US 8,053,164 B2
(45) Date of Patent: Nov. 8, 2011

(54) RESIST COMPOSITION AND METHOD FOR FORMING A PATTERN USING THE SAME

(75) Inventors: Bo-Sung Kim, Seoul (KR); Seung-Jun Lee, Yongin-si (KR); Jung-Mok Bae, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 373 days.

(21) Appl. No.: 12/363,459

(22) Filed: Jan. 30, 2009

(65) Prior Publication Data

US 2010/0055611 A1    Mar. 4, 2010

(30) Foreign Application Priority Data

Sep. 1, 2008    (KR) .................. 10-2008-0085858

(51) Int. Cl.
*G03F 7/00* (2006.01)
*G03F 7/004* (2006.01)
*G03F 7/26* (2006.01)
*G03F 7/40* (2006.01)

(52) U.S. Cl. ............... 430/270.1; 430/281.1; 430/286.1; 430/311; 430/317; 430/318; 430/330; 430/331; 430/913; 430/927

(58) Field of Classification Search ............... 430/270.1, 430/927, 281.1, 286.1, 913, 311, 317, 318, 430/330, 331
See application file for complete search history.

(56) References Cited

U.S. PATENT DOCUMENTS

| | | | | |
|---|---|---|---|---|
| 6,753,130 | B1 * | 6/2004 | Liu et al. | 430/313 |
| 7,041,604 | B2 * | 5/2006 | Miller et al. | 438/735 |
| 7,148,142 | B1 * | 12/2006 | Dakshina-Murthy et al. | 438/678 |
| 7,163,888 | B2 * | 1/2007 | Gehoski et al. | 438/627 |
| 7,235,474 | B1 * | 6/2007 | Dakshina-Murthy et al. | 438/597 |
| 7,241,395 | B2 * | 7/2007 | Sreenivasan et al. | 216/54 |
| 7,419,611 | B2 * | 9/2008 | DiPietro et al. | 216/54 |
| 7,655,307 | B2 * | 2/2010 | Kim et al. | 428/423.1 |
| 7,696,100 | B2 * | 4/2010 | Maekawa | 438/720 |
| 7,750,059 | B2 * | 7/2010 | Jung et al. | 522/6 |
| 7,837,459 | B2 * | 11/2010 | Colburn et al. | 425/385 |
| 2006/0081557 | A1 | 4/2006 | Xu et al. | |
| 2007/0267764 | A1 | 11/2007 | Morimoto | |
| 2009/0266583 | A1 * | 10/2009 | Nagasaki et al. | 174/250 |

FOREIGN PATENT DOCUMENTS

| | | |
|---|---|---|
| JP | 06-194826 | 7/1994 |
| JP | 2003221420 A * | 8/2003 |
| JP | 2006-142756 | 6/2006 |
| JP | 2006-173277 | 6/2006 |
| JP | 2007-329276 | 12/2007 |
| JP | 2009185114 A * | 8/2009 |
| KR | 1020000076692 | 12/2000 |
| KR | 1020070105040 | 10/2007 |

OTHER PUBLICATIONS

English language machine translation pf JP 2003-221420 (no date).*
Machine translation of JP 2003-221420 (no date).*

* cited by examiner

*Primary Examiner* — Amanda C. Walke
(74) *Attorney, Agent, or Firm* — F. Chau & Associates, LLC (57) ABSTRACT

The present invention relates to a resist composition with a hardener and a solvent, and a method for forming a pattern using the resist composition. The hardener has a thermal-decomposable core part, and a first photosensitive bond art. The solvent has a low-molecular resin, and a second photosensitive bond part.

17 Claims, 9 Drawing Sheets

RESIST COMPOSITION AND METHOD FOR FORMING A PATTERN USING THE SAME

CROSS-REFERENCE TO RELATED APPLICATION

This application claims priority to Korean Patent Application No. 10-2008-0085858 filed on Sep. 1, 2008, the disclosure of which is hereby incorporated by reference herein in its entirety.

BACKGROUND OF THE INVENTION (a) Technical Field

The present disclosure relates to a resist composition and to a method for forming a pattern using the same.

(b) Description of the Related Art

Photolithography processes are being widely used to form display devices and electronic devices. However, photolithography may involve high cost equipment such as a light exposing device and a mask, thereby possibly resulting in increased initial investment costs and lowered economic efficiency. Moreover, there may be a limit in forming ultra-minute patterns using photolithography.

Consequently, imprint lithography technology has come to the fore to allow processing without using any masks. With imprint lithography, a desired resist pattern may be formed similar to stamping a seal onto a substrate, and large amounts of minute patterns may be processed at a relatively low cost.

With the above-mentioned imprint lithography process, a resist layer may be formed on a substrate, and a mold with a predetermined pattern may be placed on the resist layer to imprint the pattern of the mold thereon. Thereafter, the resist layer with the mounted mold thereon may be hardened through light exposure or heat-treatment, and the mold may be detached from the resist layer to thereby form a resist pattern. A target metallic film may be etched through the resist pattern, and the resist pattern may then be removed through a strip process.

However, the hardened resist material may not be completely removed from the target, and thus some may remain deposited thereon. The above-mentioned unremoved resist material, may exist in the form of broken pattern particles, and may thereby make it difficult to manage the stripper or cleaner. Moreover, the above-mentioned unremoved resist material may in turn cause thin film transistor failures such as, for example, line cuts, short circuits, etc.

In an attempt to solve the above-mentioned difficulties, various different methods have been proposed, including ways of using a highly soluble stripper in the stripping process, reinforcing the time and temperature conditions of the stripping process, using a zone-to-zone filter, or exchanging the stripper. However, such methods may not solve the above-mentioned difficulties at a fundamental level.

Thus, there is a need in the art for a resist composition, a system with the resist composition, and a method for forming a pattern using the same, which includes the benefits of readily removing a resist layer after desired pattern formation without increasing the number of processing steps, and at a low cost.

SUMMARY OF THE INVENTION

Exemplary embodiments of the present invention may provide a resist composition, a system with the resist composition, and a method for forming a pattern using the same, having the benefits of readily removing a resist layer after desired pattern formation without increasing the number of processing steps, and at a low cost.

In accordance with an exemplary embodiment of the present invention, a resist composition is provided. The resist composition includes a hardener having a thermal-decomposable core part and a first photosensitive bonding part, and a solvent having a low-molecular resin and a second photosensitive bonding part.

The core part may be formed with at least one material selected from, for example, a carbonate group, a carbamate group, and a carbonyl group.

The core part may be formed with any one material selected from, for example, Formulas 1 to 3.

[Formula 1]

[Formula 2]

[Formula 3]

In the above formulas, R is R1, R2, R3, R4, or H, and

The low-molecular resin may have a molecular weight of, for example, about 100 to about 300.

The low-molecular resin may be formed with at least one material selected from, for example, norbornyl acrylate, norbornyl methacrylate, normalhexyl acrylate, normalhexyl methacrylate, isobonyl acrylate, isobonyl methacrylate, ethyleneglycol diacrylate, ethyleneglycol dimethacrylate, and diepoxyethyleneglycol.

The first and second bond parts may each contain a functional group that is capable of photo-reactively generating a radical or acid, or cross-linking by way of a separate photo-initiator.

The first and second bond parts may be formed with at least one material selected from, for example, compounds respectively including an acryl group, a methacryl group, a cinnamoyl group, and an epoxy group.

When exposed to light, the first and second bond parts may react to the light, and be cross-linked with each other.

When exposed to light and heat-treated, the core part may be denatured into a low-molecular structure.

In accordance with an exemplary embodiment of the present invention, a method for forming a pattern is provided. The method includes coating a patterning target film is coated on a substrate with at least one material selected from silicon, silicon oxide, silicon nitride, metal, and metallic oxide, depositing a resist layer on the coated patterning target film with a resist composition. The resist composition includes a hardener having a thermal-decomposable core part and a first photosensitive bond part, and a solvent having a low-molecular resin and a second photosensitive bond part. The method further includes mounting a mold with a convex portion, a recess portion, and a main body portion over the deposited resist layer, imprinting the resist layer by way of the mold to thereby form a pre-resist pattern with a pattern portion and a non-pattern portion, exposing the pre-resist pattern to light to thereby form a cured resist pattern, detaching the mold from the cured resist pattern, removing the non-pattern portion from the cured resist pattern through ashing to thereby form a resist pattern and etching the patterning target film through the resist pattern to thereby form a predetermined pattern.

In the method, the resist pattern may be, for example, heat-treated and then stripped.

The core part may be formed with at least one material selected from, for example, a carbonate group, a carbamate group, and a carbonyl group.

The core part may be formed with any one material selected from, for example, Formulas 1 to 3.

[Formula 1]

[Formula 2]

[Formula 3]

In the above formulas, R is R1, R2, R3, R4, or H, and

-continued

The low-molecular resin may have a molecular weight of about 100 to about 300.

The low-molecular resin may be formed with at least one material selected from, for example, norbornyl acrylate, norbornyl methacrylate, normalhexyl acrylate, normalhexyl methacrylate, isobonyl acrylate, isobonyl methacrylate, ethyleneglycol diacrylate, ethyleneglycol dimethacrylate, and diepoxyethyleneglycol.

The first and second bond parts may each contain a functional group that is capable of photo-reactively generating a radical or acid or cross-linking by way of a separate photo-initiator.

The first and second bond parts may be formed with at least one material selected from, for example, the compounds respectively including an acryl group, a methacryl group, a cinnamoyl group, and an epoxy group.

With the step of forming the cured resist pattern, the light exposure may be performed at a wavelength of, for example, about 365 nm for about one to about two minutes.

With the step of heat-treating the resist pattern, the heat treatment may be performed, for example, at about 200° C. to about 250° C. for about thirty minutes to about one hour.

With the step of forming the cured resist pattern, the first and second bond parts may be photo-reactively cross-linked with each other.

With the step of heat-treating the resist pattern, the core part may be denatured into a low-molecular structure.

When a resist layer with a resist composition according to an exemplary embodiment of the present invention is employed in the lithography process, a photosensitive functional group and a functional group to be low-molecular structured through the heat treatment at a high temperature exist in the resist composition, and therefore the resist layer may be readily removed after the desired pattern formation while being dissolved in a stripper.

Furthermore, with the use of a lithography system with a resist layer according to an exemplary embodiment of the present invention, the strip or cleaning equipment may be simply and efficiently managed at a low cost.

BRIEF DESCRIPTION OF THE DRAWINGS

Exemplary embodiments of the present invention can be understood in more detail from the following description taken in conjunction with the accompanying drawings in which.

DETAILED DESCRIPTION OF THE EXEMPLARY EMBODIMENTS OF THE INVENTION

The present invention will be described more fully hereinafter with reference to the accompanying drawings, in which exemplary embodiments of the invention are shown.

As those skilled in the art would realize, the described exemplary embodiments may be modified in various different ways, all without departing from the spirit or scope of the present invention.

A resist composition according to an exemplary embodiment of the present invention will now be described in detail.

A resist composition according to an exemplary embodiment of the present invention may include a hardener having a thermal-decomposable core part and a first photosensitive bond part, and a solvent having a low-molecular resin with a molecular weight of, for example, about 50 to about 300 and a second photosensitive bond part.

A resist compound contained in the resist composition will now be described with reference to FIG. 1 to FIG. 4.

Figure 1:
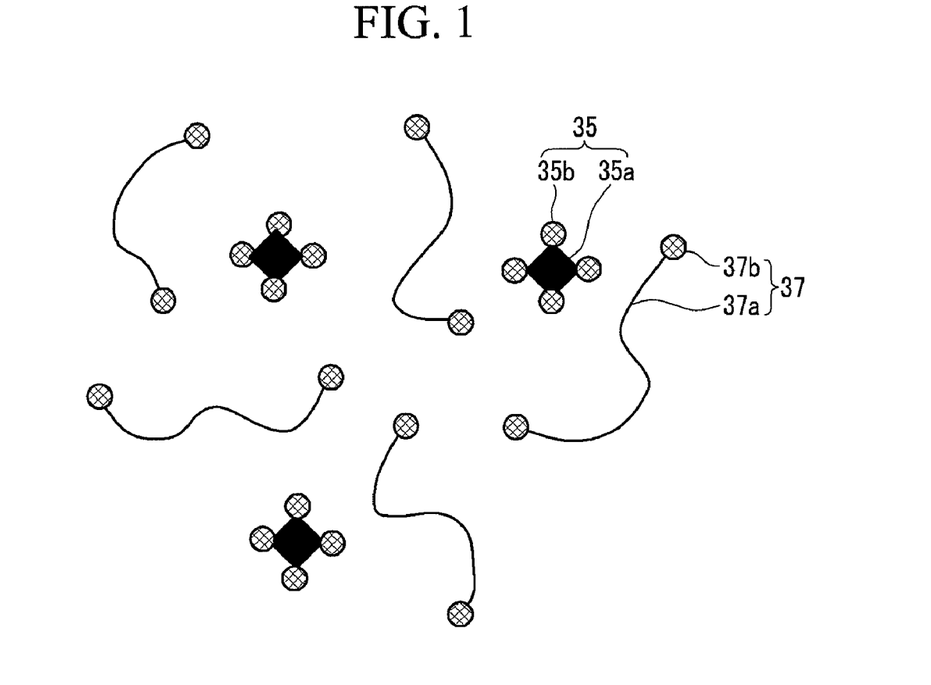
FIG. 1 to FIG. 4 are schematic views conceptually illustrating a resist compound contained in a resist composition according to an exemplary embodiment of the present invention.

FIG. 1 conceptually illustrates a resist compound where a hardener 35 is mixed with a solvent 37. The hardener 35 has a rhombus-marked core part 35a, and a lattice-marked first photosensitive bond part 35b bonded to the core part 35a. The solvent 37 has a solid line-marked low-molecular resin 37a, and a lattice-marked second photosensitive bond part 37b.

The hardener 35 and the solvent 37 contain a photo-curable functional group that is capable of photo-reactively generating a radical or acid, or cross-linking by way of a separate photo-initiator.

The core part 35a may be selected from, for example, a carbonate group, a carbamate group, and a carbonyl group. The core part 35a may be formed, for example, with at least one material selected from Formulas 1 to 3.

[Formula 1]

[Formula 2]

[Formula 3]

In the above formulas, R is R1, R2, R3, R4, or H, and

The first and second bond parts 35b and 37b may contain, for example, a functional group that is capable of photo-reactively generating a radical or acid, or cross-linking by way of a separate photo-initiator. The first and second bond parts 35b and 37b may be formed, for example, with at least one material selected from compounds respectively including an acryl group, a methacryl group, a cinnamoyl group, and an epoxy group.

A part of the specific structure of the hardener 35 is illustrated in FIG. 5A to FIG. 5F. However, the hardener 35 is not limited in kind thereto.

The low-molecular resin 37a may have a molecular weight of, for example, about 50 to about 300, and preferably of about 100 to about 150. The low-molecular resin 37a may be formed with, for example, at least one material selected from norbornyl acrylate, norbornyl methacrylate, normalhexyl acrylate, normalhexyl methacrylate, isobonyl acrylate, isobonyl methacrylate, ethyleneglycol diacrylate, ethyleneglycol dimethacrylate, and diepoxyethyleneglycol.

Figure 2:
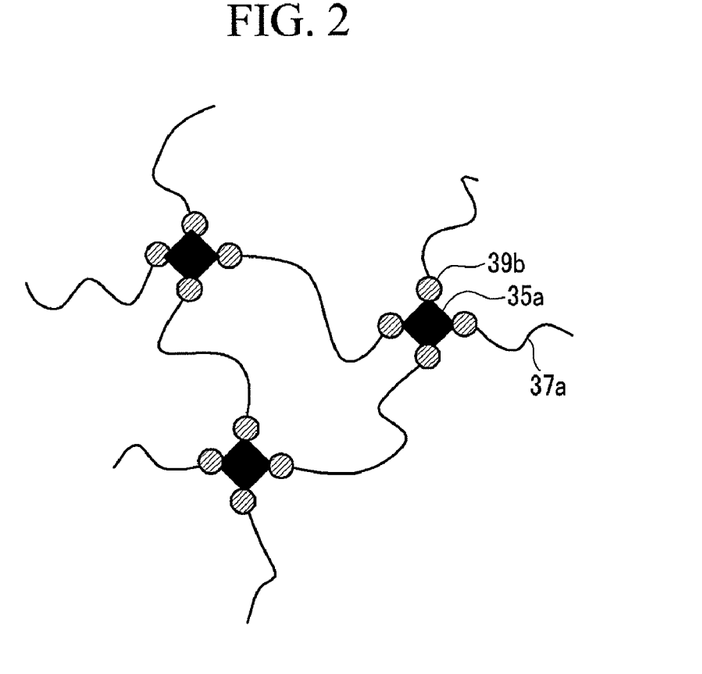
Figure 3:
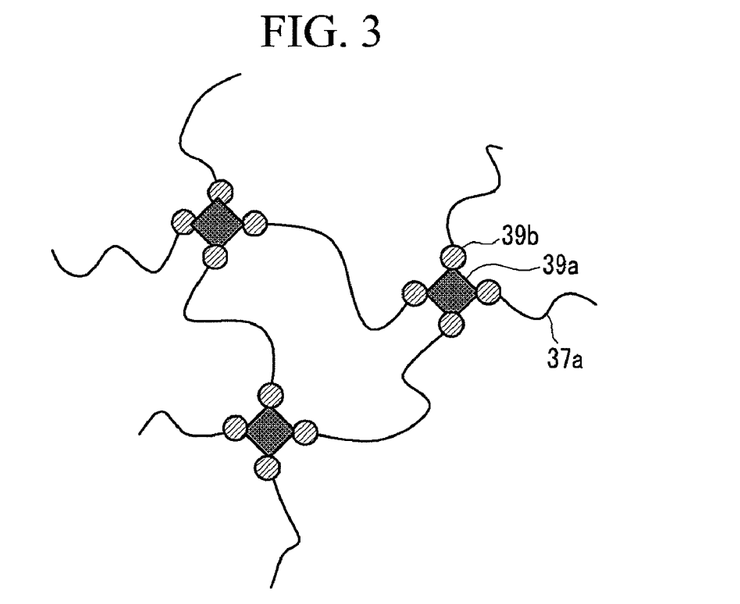

As shown in FIG. 1, when a resist layer with a simply mixed resist compound is exposed to light, the first and second bond parts 35b and 37b each contained in the hardener 35 and the solvent 37 photo-react so that they are cross-linked with each other at the diagonal line-marked photo-reaction regions 39b of FIG. 2.

With the photo-curing mechanism, the hardener 35 itself generates a radical or acid by way of photo-reaction, and the generated radical or acid reacts with the low-molecular resin 37a. Alternatively, a radical or acid generated by a separate photo-initiator may react with the hardener 35, and subsequently with the low-molecular resin 37a.

Figure 15:
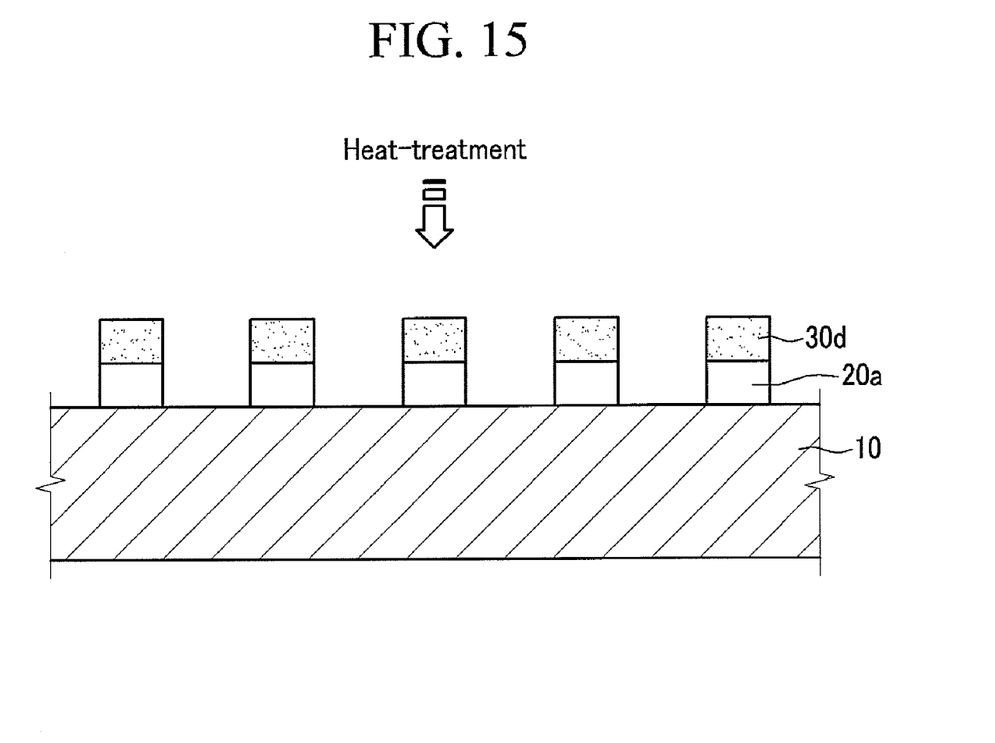

As shown in FIG. 15, the target pattern is formed at the desired location, and the unneeded cured resist layer is removed by, for example, a stripper during a stripping process. In the case where a resist layer with a resist composition according to an exemplary embodiment of the present invention is heat-treated at a high temperature, the core part 35a having a thermal-decomposable functional group therein may be denatured and decomposed itself. The heat treatment is performed at, for example, about 200° C. to about 250° C. for about thirty minutes to about one hour. The core part 35a has a structure connected with a carbonate group, a carbamate group, a carbonyl group, etc., and may be denatured into the colored rhombus-marked decomposable low-molecular structure 39a shown in FIG. 3 while, for example, carbon dioxide, urea, etc., are extricated therefrom through the heat treatment performed at a high temperature.

Figure 4:
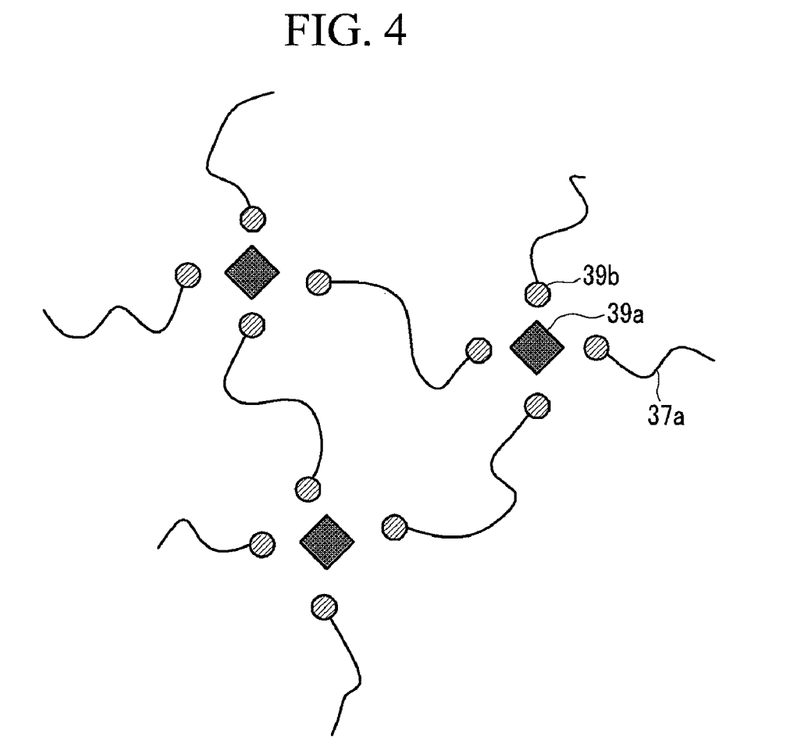
Figure 5A:
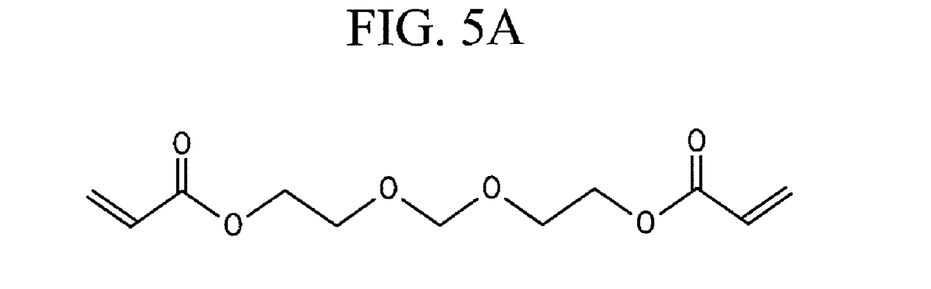
FIG. 5A to FIG. 5F illustrate structural formulas of a hardener according to an exemplary embodiment of the present invention.
Figure 5B:
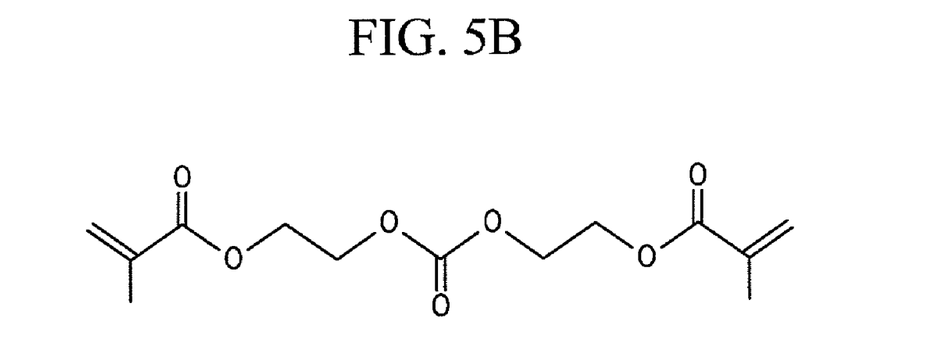
Figure 5C:
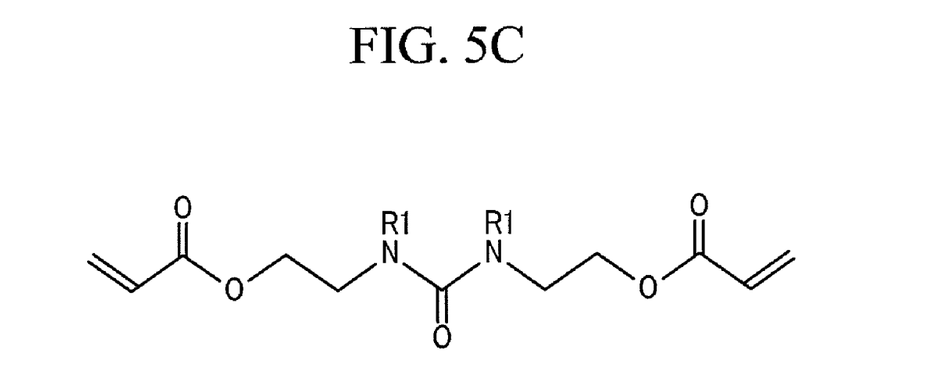
Figure 5D:
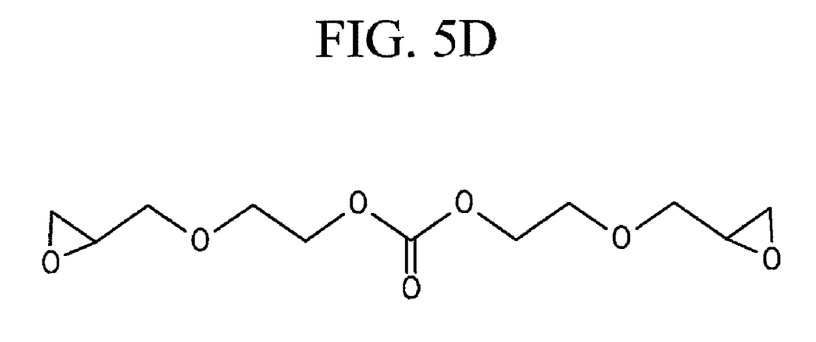
Figure 5E:
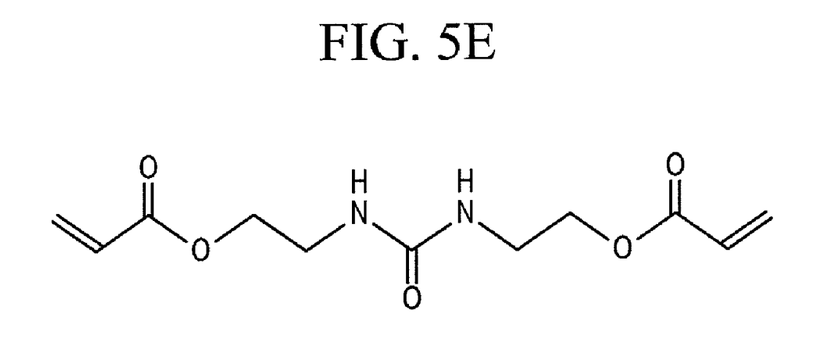
Figure 5F:
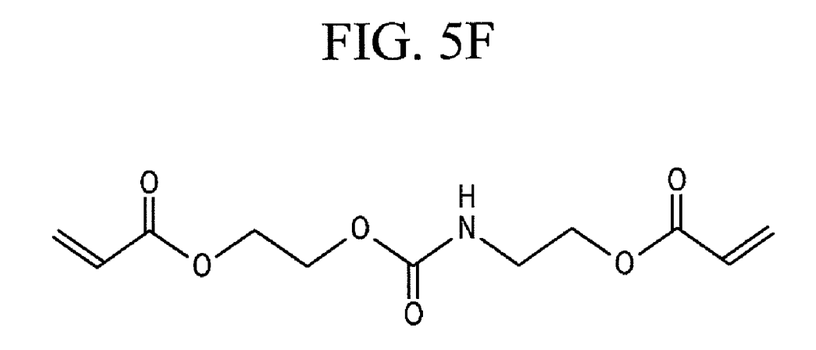

As shown in FIG. 4, the core parts are each denatured into a low molecular structure and decomposed so that they can be readily dissolved in a stripper, and are removed during the stripping process.

A system basically employed in forming a pattern using a resist composition according to an exemplary embodiment of the present invention will now be described with reference to FIG. 9.

A system basically employed in forming a pattern using a resist composition according to an exemplary embodiment of the present invention includes a substrate 10, a mold 40 placed over the substrate 10 with a convex portion 41, a recess portion 43, and a main body portion 45, a resist layer 30 formed between the substrate 10 and the mold 40, and a silicon-based patterning target film 20 formed between the substrate 10 and the resist layer 30. The resist layer 30 is deposited with a resist composition containing a hardener with a thermal-decomposable core part and a first photosensitive bond part, and a solvent with a low-molecular resin having a molecular weight of, for example, about 50 to about 300 and a second photosensitive bond part. The patterning target film 20 may be formed with, for example, any one material from silicon oxide, silicon nitride, metal, and metallic oxide, instead of silicon.

The present invention will now be described in detail reference to an example, but is not limited thereto.

An example of the present invention will now be described with reference to FIG. 6 to FIG. 16.

EXAMPLE

A method for forming a pattern using a resist composition will be described with the example.

Figure 6:
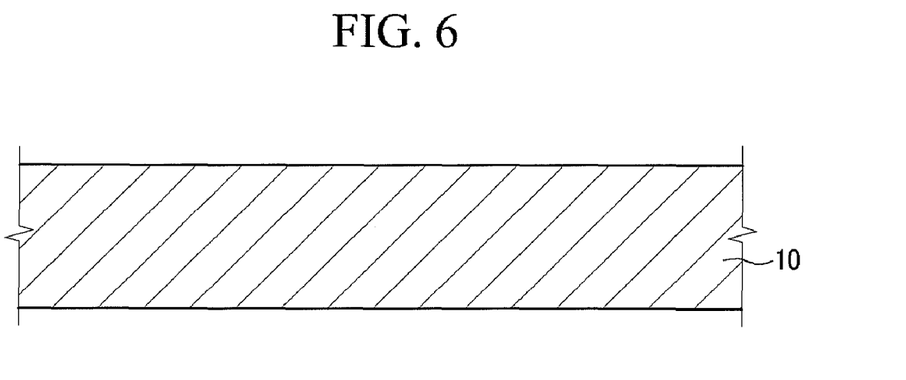
FIG. 6 to FIG. 16 are cross-sectional views sequentially illustrating the steps of forming a pattern using a resist composition according to an Example of the present invention.
Figure 7:
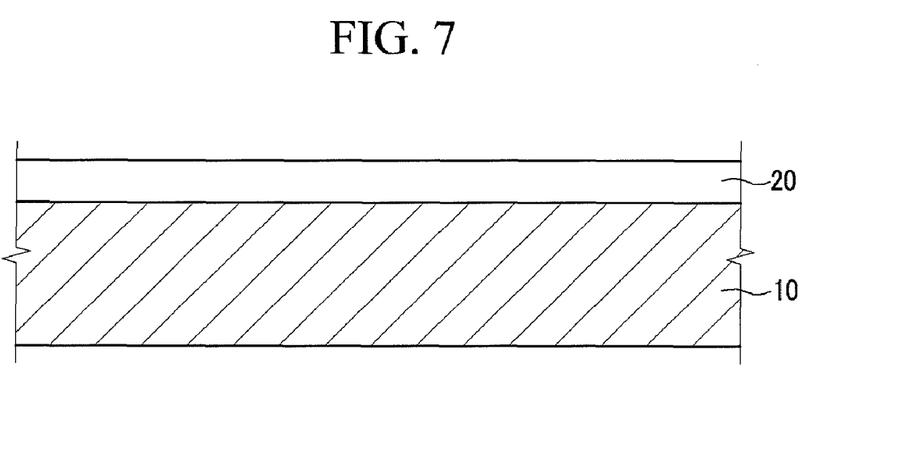

First, as shown in FIG. 6, a glass material-based substrate 10 with a size of about 300× about 400 mm was prepared. Thereafter, as shown in FIG. 7, a silicon-based patterning target film 20 was coated on the substrate 10. The patterning target film 20 may be formed with any one material selected from silicon oxide, silicon nitride, metal, and metallic oxide, instead of silicon.

Figure 8:
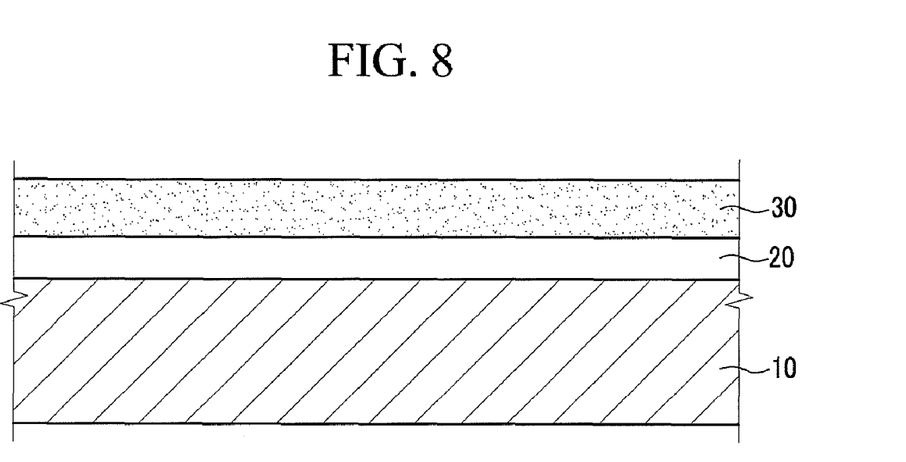

Then, as shown in FIG. 8, a resist layer 30 was coated on the patterning target film 20 with a resist composition. The resist composition contained a hardener with a thermal-decomposable core part and a photosensitive bond part, and a solvent with a low-molecular resin and a photosensitive bond part. The low-molecular resin 37a was formed with at least one material selected from norbornyl acrylate, norbornyl methacrylate, normalhexyl acrylate, normalhexyl methacrylate, isobonyl acrylate, isobonyl methacrylate, ethyleneglycol diacrylate, ethyleneglycol dimethacrylate, and diepoxyethyleneglycol. The photosensitive bond part of the solvent was formed with at least one material selected from compounds respectively including an acryl group, a methacryl group, a cinnamoyl group, and an epoxy group.

Figure 9:
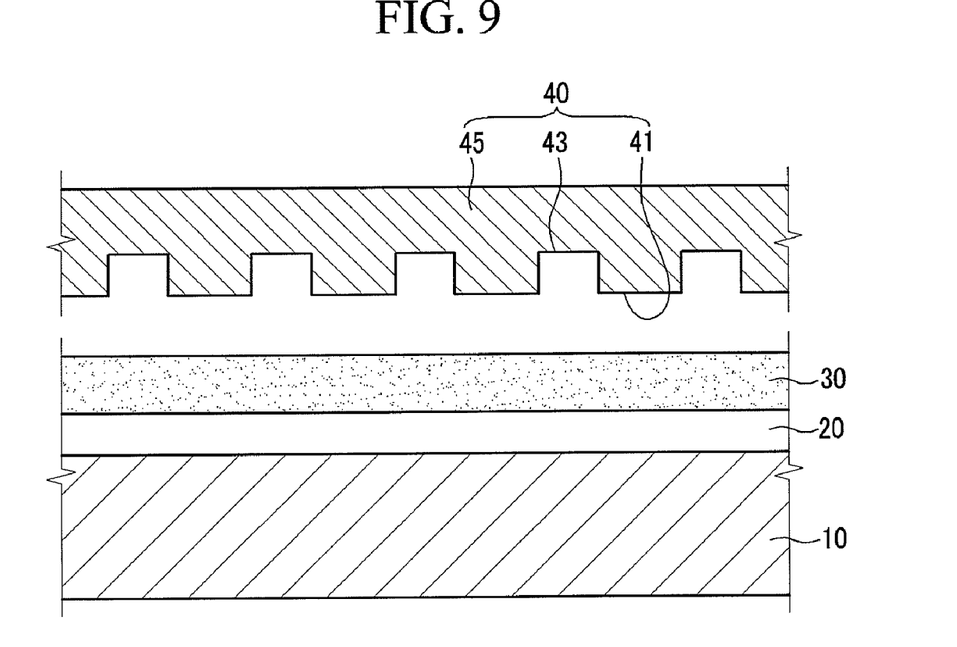
Figure 10:
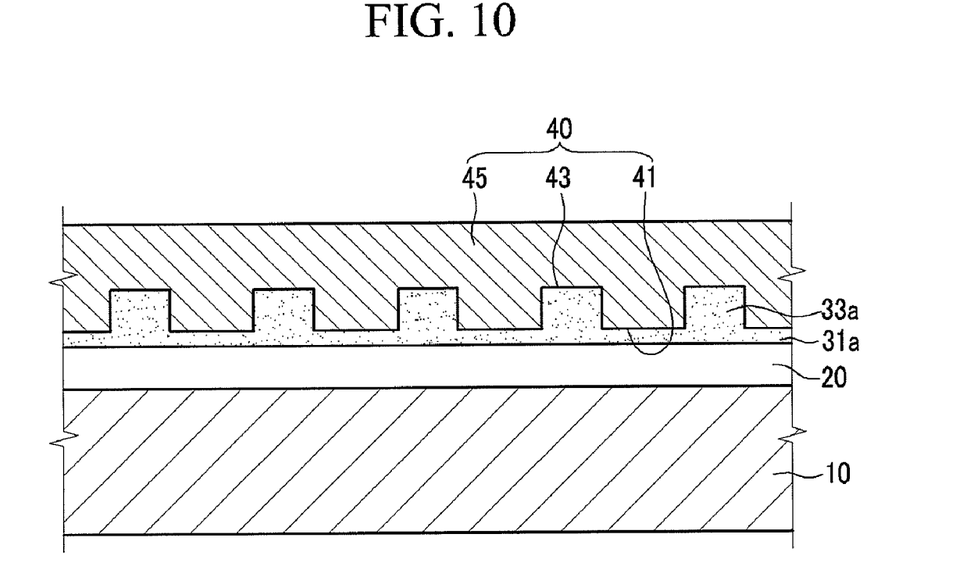

As shown in FIG. 9, a mold 40 with a convex portion 41, a recess portion 43, and a main body portion 45 was mounted over the coated resist layer 30. At this time, the mold 40 should be correctly disposed such that a target pattern could be formed at the desired location. As shown in FIG. 10, the resist layer 30 was imprinted by way of the mold 40 to thereby form a pre-resist pattern 30a with a pattern portion 33a and a non-pattern portion 31a.

Figure 11:
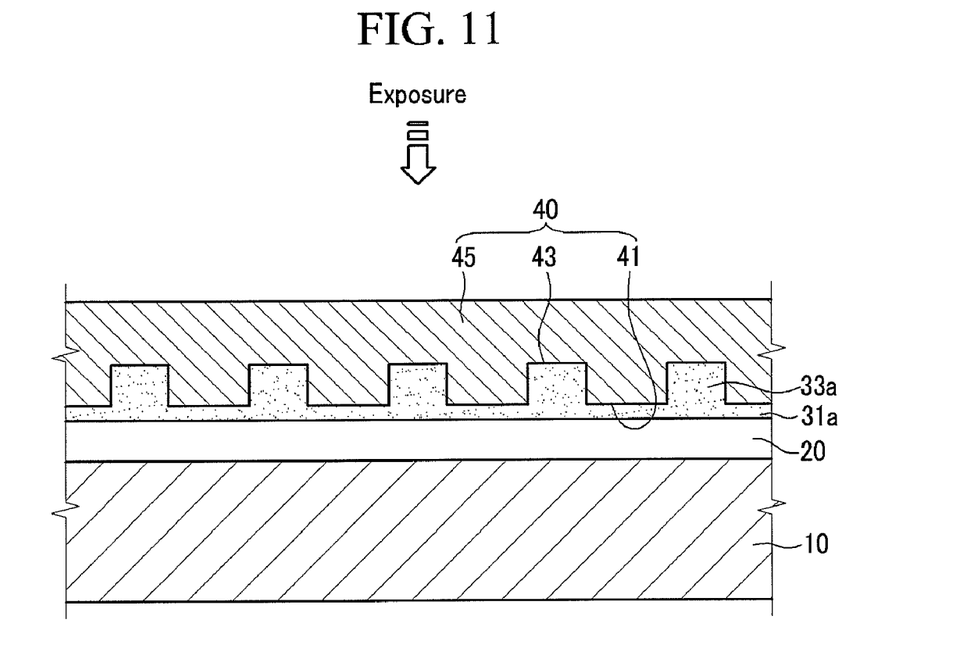
Figure 12:
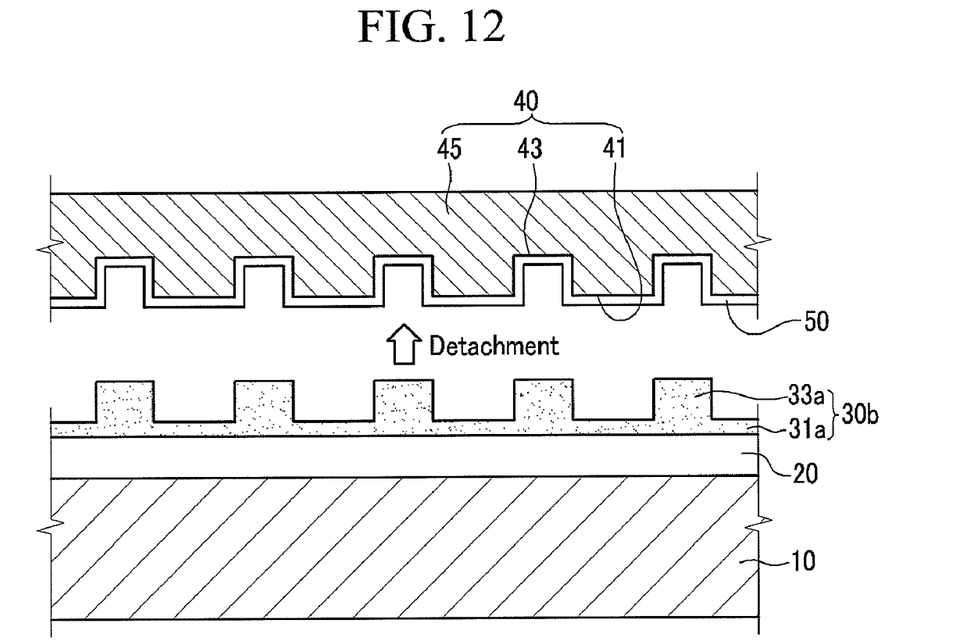
Figure 13:
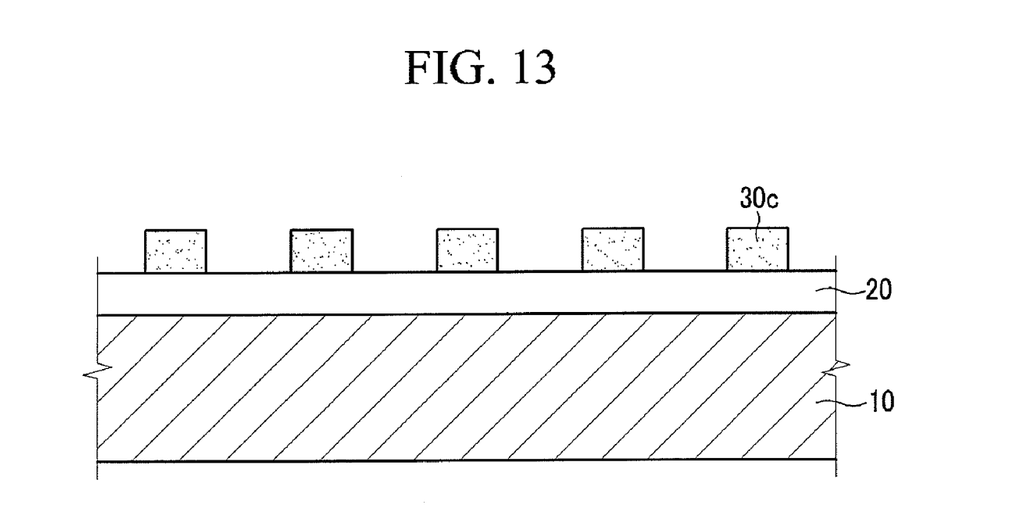

As shown in FIG. 11, the pre-resist pattern 30a was exposed to light at a wavelength of about 365 nm for about one minute and about thirty seconds using an exposure device to thereby form a cured resist pattern 30b. Thereafter, as shown in FIG. 12, the mold 40 was detached from the cured resist pattern 30b. The hardener and the low-molecular resin of the cured resist pattern 30b were combined with each other through photo-reaction. As shown in FIG. 13, the unneeded non-pattern portion 31a was removed from the cured resist pattern 30b through ashing to thereby form a resist pattern 30c.

Figure 14:
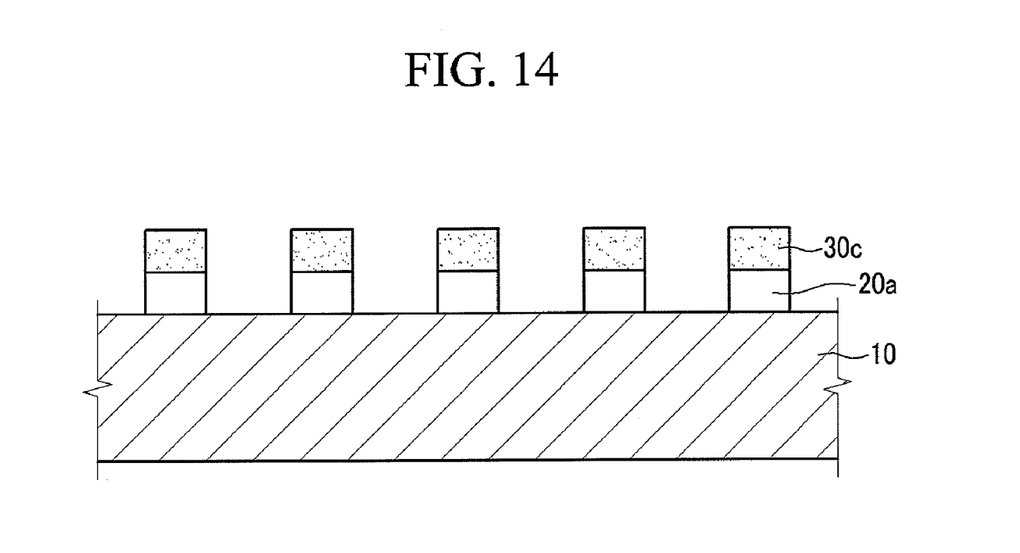

As shown in FIG. 14, the patterning target film 20 was etched through the resist pattern 30c to thereby form a predetermined pattern 20a.

Figure 16:
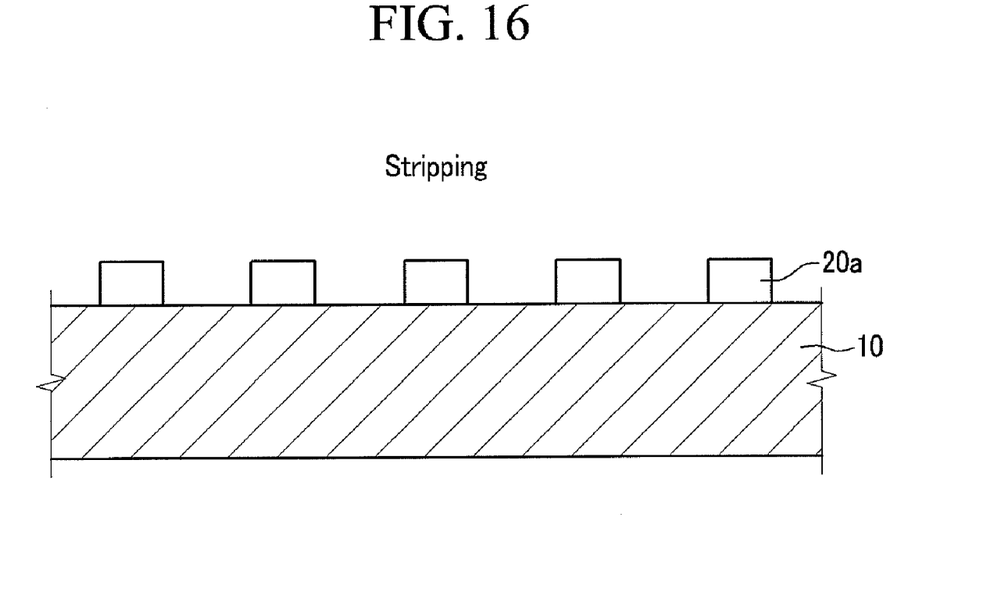

As shown in FIG. 15, the resist pattern 30c shown in FIG. 14 was heat-treated in an oven at about 225° C. for about 45 minutes, thereby forming a denatured resist pattern 30d such that the thermal-decomposable core part thereof could be readily dissolved in a stripper. Finally, as shown in FIG. 16, the heat-treated and denatured resist pattern 30d was removed from the pattern 20a through stripping.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A resist composition comprising:
a hardener having a thermal-decomposable core part and a first photosensitive bond part, wherein the core part is formed with at least one material selected from the group consisting of Formulas 1 to 3:

[Formula 1]

[Formula 2]

[Formula 3]

where R is R1, R2, R3, R4, or H, and and
a solvent having a low-molecular resin and a second photosensitive bond part.

2. The resist composition of claim 1, wherein the low-molecular resin has a molecular weight of about 50 to about 300.

3. The resist composition of claim 1, wherein the low-molecular resin is formed with at least one material selected from the group consisting of norbornyl acrylate, norbornyl methacrylate, normalhexyl acrylate, normalhexyl methacrylate, isobonyl acrylate, isobonyl methacrylate, ethyleneglycol diacrylate, ethyleneglycol dimethacrylate, and diepoxyethyleneglycol.

4. A resist composition of claim 1, wherein the first and second bond parts each comprise a functional group that is capable of photo-reactively generating a radical or acid or cross-linking by way of a separate photo-initiator.

5. The resist composition of claim 4, wherein the first and second bond parts are formed with at least one material selected from the group consisting of compounds respectively including an acryl group, a methacryl group, a cinnamoyl group, and an epoxy group.

6. The resist composition of claim 1, wherein when exposed to light, the first and second bond parts react to the light and are cross-linked with each other.

7. The resist composition of claim 6, wherein when exposed to light and heat-treated, the core part is denatured into a low-molecular structure.

8. A method for forming a pattern, the method comprising the steps of:
coating a patterning target film on a substrate with at least one material selected from the group consisting of silicon, silicon oxide, silicon nitride, metal, and metallic oxide;
depositing a resist layer on the coated pattering target film with a resist composition, the resist composition comprising a hardener having a thermal-decomposable core part and a first photosensitive bond part, and a solvent having a low-molecular resin and a second photosensitive bond part, wherein the core part is formed with at least one material selected from the group consisting of Formulas 1 to 3:

[Formula 1]

[Formula 2]

[Formula 3]

where R is R1, R2, R3, R4, or H, and mounting a mold over the deposited resist layer, the mold having a convex portion, a recess portion, and a main body portion;
imprinting the resist layer with the mold to thereby form a pre-resist pattern with a pattern portion and a non-pattern portion;
exposing the pre-resist pattern to light to thereby form a cured resist pattern;
detaching the mold from the cured resist pattern;
removing the non-pattern portion from the cured resist pattern through ashing to thereby form a resist pattern; and
etching the patterning target film through the resist pattern to thereby form a predetermined pattern.

9. The method of claim 8, wherein after the etching of the patterning target film through the resist pattern to thereby form the predetermined pattern, the method further comprising the steps of:
heat-treating the resist pattern; and
stripping the heat-treated resist pattern.

10. The method of claim 8, wherein the low-molecular resin has a molecular weight of about 100 to about 300.

11. The method of claim 10, wherein the low-molecular resin is formed with at least one material selected from the group consisting of norbornyl acrylate, norbornyl methacrylate, normalhexyl acrylate, normalhexyl methacrylate, isobonyl acrylate, isobonyl methacrylate, ethyleneglycol diacrylate, ethyleneglycol dimethacrylate, and diepoxyethyleneglycol.

12. The method of claim 8, wherein the first and second bond parts each comprise a functional group that is capable of photo-reactively generating a radical or acid or cross-linking by way of a separate photo-initiator.

13. The method of claim 12, wherein the first and second bond parts are formed with at least one material selected from the group consisting of compounds respectively including an acryl group, a methacryl group, a cinnamoyl group, and an epoxy group.

14. The method of claim 8, wherein in the step of forming the cured resist pattern, the light exposure is performed at a wavelength of about 365 nm for about one to about two minutes.

15. The method of claim 9, wherein in the heat-treating the resist pattern, the heat-treatment is performed at about 200° C. to about 250° C. for about 30 minutes to about one hour.

16. The method of claim 8, wherein in the forming the cured resist pattern, the first and second bond parts are photo-reactively cross-linked with each other.

17. The method of claim 9, wherein in the heat-treating the resist pattern, the core part is denatured into a low-molecular structure.

* * * * *